United States Patent
Li et al.

(10) Patent No.: US 10,001,686 B2
(45) Date of Patent: Jun. 19, 2018

(54) ARRAY SUBSTRATE AND FABRICATION METHOD THEREOF, AND DISPLAY DEVICE

(71) Applicants: BOE Technology Group Co., Ltd., Beijing (CN); Beijing BOE Optoelectronics Technology Co., Ltd., Beijing (CN)

(72) Inventors: Jiapeng Li, Beijing (CN); Lei Chen, Beijing (CN); Lei Zhang, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days. days.

(21) Appl. No.: 15/522,878

(22) PCT Filed: Sep. 18, 2016

(86) PCT No.: PCT/CN2016/099226
§ 371 (c)(1),
(2) Date: Apr. 28, 2017

(87) PCT Pub. No.: WO2017/071423
PCT Pub. Date: May 4, 2017

(65) Prior Publication Data
US 2017/0351150 A1    Dec. 7, 2017

(30) Foreign Application Priority Data
Oct. 29, 2015  (CN) .......................... 2015 1 0719693

(51) Int. Cl.
G02F 1/136     (2006.01)
G02F 1/1362    (2006.01)
H01L 27/12     (2006.01)

(52) U.S. Cl.
CPC .. G02F 1/136213 (2013.01); G02F 1/136227 (2013.01); G02F 1/136286 (2013.01);
(Continued)

(58) Field of Classification Search
None
See application file for complete search history.

(56) References Cited

U.S. PATENT DOCUMENTS 5,973,763 A *  10/1999  Fujimura .............. G02F 1/1339
                                                        349/153
6,490,022 B1 * 12/2002  Hoshino ............... G02F 1/1334
                                                        349/153
(Continued)

FOREIGN PATENT DOCUMENTS

CN    102890369 A    1/2013
CN    103941504 A    7/2014
(Continued)

OTHER PUBLICATIONS

Aug. 2, 2017—(CN) First Office Action Appn 201510719693.4 with English Tran.
(Continued)

*Primary Examiner* — James Dudek
(74) *Attorney, Agent, or Firm* — Banner & Witcoff, Ltd.

(57) ABSTRACT

An array substrate and a fabrication method thereof, and a display device are provided. The array substrate includes a base substrate and a peripheral lead, a ground signal terminal, a conductive adhesive, and a barrier wall structure located on the base substrate, wherein, the conductive adhesive is connected with the ground signal terminal, and the barrier wall structure is located between the peripheral lead and the ground signal terminal, and configured for blocking the conductive adhesive from diffusing toward the peripheral lead.

17 Claims, 7 Drawing Sheets

(52) U.S. Cl.
CPC ........ *H01L 27/124* (2013.01); *H01L 27/1248* (2013.01); *H01L 27/1288* (2013.01)

(56) References Cited

U.S. PATENT DOCUMENTS

| | | | | |
|---|---|---|---|---|
| 6,562,175 B1* | 5/2003 | Lin | ........................ | G02F 1/1339 156/272.2 |
| 2003/0151714 A1* | 8/2003 | Takahashi | .............. | G02F 1/1345 349/153 |
| 2008/0018843 A1* | 1/2008 | Park | ....................... | G02F 1/1339 349/139 |
| 2008/0284970 A1* | 11/2008 | Ishitani | ................. | G02F 1/1339 349/153 |
| 2009/0244422 A1 | 10/2009 | Okazaki et al. | | |
| 2009/0309099 A1 | 12/2009 | Kim et al. | | |
| 2015/0103298 A1* | 4/2015 | Lee | ................... | G02F 1/133351 349/123 |

FOREIGN PATENT DOCUMENTS

| | | |
|---|---|---|
| CN | 104460070 A | 3/2015 |
| CN | 105161506 A | 12/2015 |

OTHER PUBLICATIONS

Dec. 29, 2016—International Search Report and Written Opinion Appn PCT/CN2016/099226 with Eng Tran.

\* cited by examiner

ARRAY SUBSTRATE AND FABRICATION METHOD THEREOF, AND DISPLAY DEVICE

The application is a U.S. National Phase Entry of International Application No. PCT/CN2016/099226 filed on Sep. 18, 2016, designating the United States of America and claiming priority to Chinese Patent Application No. 201510719693.4 filed on Oct. 29, 2015. The present application claims priority to and the benefit of the above-identified applications and the above-identified applications are incorporated by reference herein in their entirety.

TECHNICAL FIELD

Embodiments of the present disclosure relate to an array substrate and a fabrication method thereof, and a display device.

BACKGROUND

A small-sized liquid crystal display (LCD) product used in a mobile phone, a tablet personal computer, and the like is mainly obtained in a mode as follows:

A large-sized color filter motherboard is cell-assembled with an array motherboard to form a display motherboard, the display motherboard is cut to form a Q-panel configured for standard testing which includes several small-sized LCD products; where, "Q" represents "quality". A color filter surface of the Q-panel is coated with a layer of transparent conductive layer, which plays a role in transferring an electrostatic charge accumulated on the color filter. Next, the Q-panel is cut again, to form a plurality of single panels, that is, the plurality of small-sized LCD products. Therein, in order to release the electrostatic charge accumulated in single panel, a conductive adhesive is coated on a region of the array substrate of the single panel not covered by a color filter substrate; one end of the conductive adhesive is connected with the transparent conductive layer on the color filter substrate, and the other end is connected with a ground signal terminal on the array substrate, so as to eliminate the electrostatic charge accumulated on the array substrate and the color filter substrate.

SUMMARY

An embodiment of the present disclosure provides an array substrate, comprising a base substrate, and a peripheral lead, a ground signal terminal, a conductive adhesive, and a barrier wall structure located on the base substrate, wherein, the conductive adhesive is connected with the ground signal terminal, and the barrier wall structure is located between the peripheral lead and the ground signal terminal and configured for blocking the conductive adhesive from diffusing toward the peripheral lead.

In an example, the base substrate has an opposing region opposite to an counter substrate and a peripheral region located outside the opposing region; the barrier wall structure is located at a corner of the opposing region adjacent to the peripheral region, and the ground signal terminal is located in the peripheral region.

In an example, the conductive adhesive is connected with the barrier wall structure.

In an example, the barrier wall structure includes at least one of a first barrier wall and a second barrier wall, the corner of the opposing region of the base substrate is formed at an intersection of a boundary between the opposing region and the peripheral region of the base substrate and an edge of the base substrate, an orthogonal projection of the first barrier wall on the base substrate has a first straight edge and a second straight edge connected with each other, the first straight edge overlaps an edge of the base substrate, and the second straight edge overlaps the boundary between the opposing region and the peripheral region of the base substrate; an orthogonal projection of the second barrier wall on the base substrate is an arc strip, the arc strip has two arc edges, and circle center(s) of the two arc edges is located on a side of the arc toward the corner; or, the orthogonal projection of the second barrier wall on the base substrate is a strip, and an acute included angle is formed between a length direction of the strip and each of two boundary lines forming the corner.

In an example, the barrier wall structure includes the first barrier wall and the second barrier wall, and in a direction perpendicular to the base substrate, a height of the first barrier wall is less than that of the second barrier wall.

In an example, the barrier wall structure includes the second barrier wall, the orthogonal projection of the second barrier wall on the base substrate has a third straight edge and a fourth straight edge opposite to each other, the third straight edge overlaps the edge of the base substrate, and the fourth straight edge overlaps the boundary line between the opposing region and the peripheral region of the base substrate.

In an example, the barrier wall structure includes one first barrier wall and a plurality of the second barrier walls, a number of the second barrier walls is 2 to 5, the first barrier wall and the plurality of second barrier walls are spaced apart from each other, and in a direction away from the first barrier wall and towards the second barrier wall, heights of the respective second barrier walls are sequentially increased.

In an example, a value range of a height of the first barrier wall is 500 Å to 1500 Å, and in the direction away from the first barrier wall, a value range of a height of a last second barrier wall is 3500 Å to 4500 Å.

In an example, a value range of a height difference between the second barrier wall closest to the first barrier wall and the first barrier wall is 200 Å to 1000 Å; and a value range of a height difference between any two adjacent ones of second barrier walls is 200 Å to 1000 Å.

In an example, a value range of a distance between a center of a side, close to the first barrier wall, of the second barrier wall closest to the first barrier wall and the first barrier wall is 8 µm to 15 µm; and/or, a value range of a distance between adjacent ones of the second barrier walls is 8 µm to 15 µm.

In an example, the distance between the center of the side, close to the first barrier wall, of the second barrier wall closest to the first barrier wall and the first barrier wall is greater than the distance between any two adjacent ones of second barrier walls, and in the direction away from the first barrier wall and towards the second barrier wall, distances between adjacent ones of the second barrier walls are sequentially reduced.

In an example, the orthogonal projection of the first barrier wall on the base substrate is an isosceles right-angled triangle, a side length of the isosceles right-angled triangle is in a value range of 80 µm to 120 µm, and a value range of a width of the orthogonal projection of the second barrier wall on the base substrate is 8 µm to 12 µm.

Another embodiment of the present disclosure provides a fabrication method of an array substrate, the fabrication method comprising: forming a film layer on a base substrate; performing a patterning process on the film layer to form a barrier wall structure; wherein, the barrier wall structure is configured for blocking a conductive adhesive from diffusing toward a peripheral lead, the barrier wall structure is located between the peripheral lead and a ground signal terminal, and the ground signal terminal is connected with the conductive adhesive.

In an example, the barrier wall structure includes: a first barrier wall and at least two second barrier walls, the first barrier wall and the at least two second barrier walls are spaced apart from each other, and in a direction perpendicular to the base substrate, a height of the first barrier wall is less than that of the at least two second barrier walls; and in a direction away from the first barrier wall and towards the second barrier wall, heights of the at least two second barrier walls are sequentially increased;

the performing a patterning process on the film layer to form a barrier wall structure includes:
forming a photoresist layer on the film layer;
exposing and developing the base substrate with the photoresist layer formed thereon by a half-tone or a gray-tone mask, to form a photoresist completely-reserved portion, photoresist half-reserved portions whose heights are sequentially reduced, and a photoresist completely-removed portion; wherein, the photoresist completely-reserved portion corresponds to a highest second barrier wall to be formed, and the photoresist half-reserved portions whose heights are sequentially reduced respectively correspond to remaining second barrier wall(s) to be formed whose height(s) are sequentially reduced and the first barrier wall, and the photoresist completely-removed portion corresponds to a region where the barrier wall structure is not located;
removing the film layer in the region where the barrier wall structure is not located by an etching process;
forming one first barrier wall and at least two second barrier walls away from the first barrier wall by an ashing and etching process.

Yet another embodiment of the present disclosure provides a display device, comprising: an counter substrate a transparent conductive layer formed therein; wherein, the display device further comprises: the above described array substrate which is opposite to the counter substrate; and the transparent conductive layer being connected with the ground signal terminal on the array substrate through the conductive adhesive.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1:
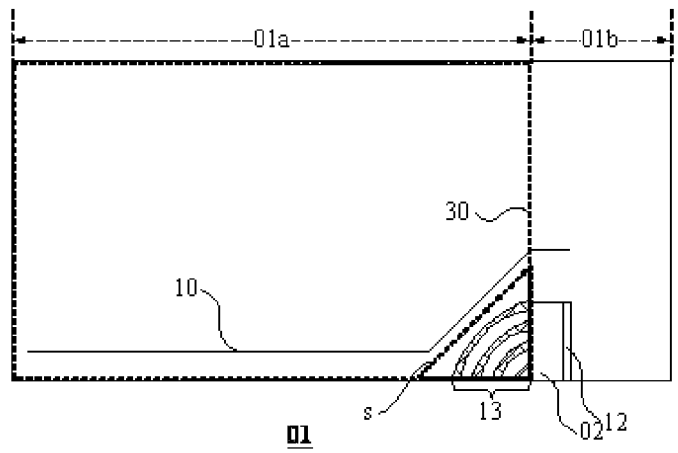
FIG. 1 is a top view schematic diagram of a structure of an array substrate provided by an embodiment of the present disclosure.

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just part of but not all of the embodiments of the present disclosure. Based on the described embodiments herein, those skilled in the art can obtain other embodiment(s), without any inventive work, which should be within the scope of the present disclosure.

In a process of cutting the Q-panel to form a plurality of small-sized single panels, a breakage such as a fine microcrack which is difficult to be observed by a human eye may be generated at a cutting edge of a color filter substrate of each single panel. As a result, when the conductive adhesive is coated on the array substrate subsequently, the conductive adhesive is liable to penetrate through the breakage of the cutting edge of the color filter substrate to an inner region after the array substrate and the color filter substrate are cell-assembled. Since a peripheral lead such as a gate line lead and a data line lead which is densely arranged and configured for an external signal is provided at the cutting edge of the periphery of the array substrate close to the color filter substrate, since the conductive adhesive has electrical conductivity, when the conductive adhesive permeates inwardly and flows to the peripheral lead, signal crosstalk of the peripheral lead will be generated, and thus, display abnormality of an LCD product will be generated, affecting display quality.

The embodiments of the present disclosure provide an array substrate and a fabrication method thereof, and a display device, capable of blocking, after the array substrate and the color filter substrate are cell-assembled, the conductive adhesive from penetrating from the cutting breakage of the color filter substrate inwardly to the peripheral lead of the array substrate, to avoid signal crosstalk of the peripheral lead, and to alleviate a problem of display defect of the display device generated due to inward penetration of the conductive adhesive.

It should be noted that, all terms (including technical and scientific terms) used in the embodiments of the present disclosure have a same meaning as commonly understood by those ordinarily skilled in the art to which the present disclosure belongs. It should also be understood that, terms such as those defined in a common dictionary should be explained as having meanings consistent with their meanings in a context of a related art, but should not be explained by using idealized or extremely formalized meanings, unless expressly defined here.

Since sizes of respective structures involved in the embodiments of the present disclosure are very small, in order to make it clear, sizes of respective structures in the accompanying drawings of the embodiments of the present disclosure are all enlarged, which do not represent actual sizes and proportions.

As shown in FIG. 1, an embodiment of the present disclosure provides an array substrate 01, the array substrate 01 comprising: a base substrate 100, and a peripheral lead 10, a conductive adhesive 02, a ground signal terminal 12 and a barrier wall structure 13 which are formed on the base substrate 100. The ground signal terminal 12 is configured for connecting with a transparent conductive layer 30 (indicated by a rectangular dashed box in the figure) on a color filter substrate (as an example of an counter substrate) through the conductive adhesive 02; and the barrier wall structure 13 is located between the peripheral lead 10 and the ground signal terminal 12 and configured for blocking the conductive adhesive 02 from diffusing toward the peripheral lead 10.

It should be noted that, firstly, the above-described peripheral lead 10, for example, can include a gate line lead, a data line lead, and any other lead for an external signal in the array substrate 01.

Figure 2:
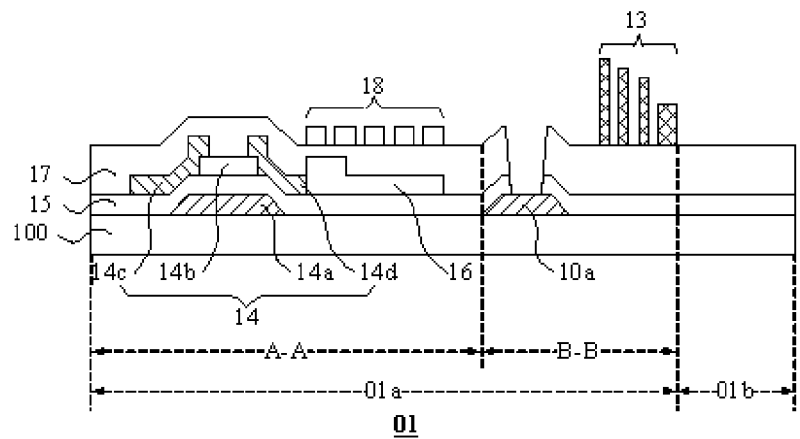
FIG. 2 is a cross-sectional view schematic diagram of a specific structure of an array substrate provided by an embodiment of the present disclosure.

As shown in FIG. 2, a position where the peripheral lead is provided is a region (marked as B-B in the figure) outside a pixel region (marked as A-A in the figure) for efficient display in the array substrate 01. By taking the peripheral lead, for example, including the gate line lead 10a, as an example, the array substrate 01 including the gate line lead 10a can be formed by a fabrication process as follows:

A gate electrode 14a, a gate line (not shown) and the gate line lead 10a connected with the gate line are formed on the base substrate 100, and the respective structures as described above can be formed by a same patterning process; thereafter, a gate insulating layer 15 covering the gate electrode 14a, the gate line and the gate line lead 10a, an active layer 14b located above the gate electrode 14a, a source electrode 14c and a drain electrode 14d provided opposite to each other, and a data line (not shown) connected with the source electrode 14c are sequentially formed, so as to form structures of respective thin film transistors (TFT) 14 in a pixel region A-A. A pixel electrode 16 overlapping with the drain electrode 14d, a passivation layer 17 covering a pattern layer including the pixel electrode 16, the data line as well as the source electrode 14c and the drain electrode 14d, and a common electrode 18 opposite to the pixel electrode 16 are formed, so as to form the above-described array substrate 01; wherein, via holes are formed in the passivation layer 17 and the gate insulating layer 15 to expose the gate line lead 10a formed thereon, so as to provide a corresponding signal to the gate line lead 10a.

In the embodiment of the present disclosure, a structure type of the liquid crystal display panel including the above-described array substrate 01 is not limited, and the above-described fabrication process is only an example.

Here, with reference to FIG. 2, the thus formed array substrate 01 includes the pixel electrode 16 and the common electrode 18 arranged opposite to each other, that is, a structure type of the liquid crystal display panel including the array substrate 01 is an advanced super dimensional switching (ADS) type.

Of course, the array substrate 01 can include only the pixel electrode 16 without the common electrode 18 formed therein. That is, the structure type of the liquid crystal display panel including the array substrate 01 is a twist nematic (TN) type. In this case, the common electrode in the color filter substrate (not shown in FIG. 2) can also be used as the transparent conductive layer 30 to release the electrostatic charge accumulated on the color filter substrate.

Secondly, a position of the barrier wall structure 13 is not limited, and can be flexibly adjusted according to the position of the ground signal terminal 12 of the array substrate 01.

For example, after the array substrate 01 and the color filter substrate are cell-assembled, when the ground signal terminal 12 is provided in a region of the array substrate 01 which is not covered by the color filter substrate and close to a corner of the color filter substrate (for the region at the corner, please refer to the region s schematically shown by a triangular dashed box in FIG. 1), the barrier wall structure 13 is correspondingly provided at the corner of the region of the array substrate 01 which is not covered by the color filter substrate, close to the ground signal terminal 12; and the barrier wall structure 13 is located between the peripheral lead 10 and the subsequently coated conductive adhesive 02, to play a role in blocking as described above.

Here, since in the related art, there is not any structure capable of playing the role of blocking provided between the peripheral lead 10 and the subsequently coated conductive adhesive 02, when the conductive adhesive having a fluid property is coated after breakage such as a fine microcrack is generated at the cutting edge of the color filter substrate of the liquid crystal display panel cell-assembled, the conductive adhesive will penetrate inwardly to the array substrate through the breakage, and through the via holes on the passivation layer 17 and the gate insulating layer 15, arriving onto a surface of the gate line lead 10a, resulting in a poor gate line signal. However, the above-described barrier wall structure 13 located between the peripheral lead 10 and the ground signal terminal 12 provided by the embodiment of the present disclosure has a certain three-dimensional structure, and is provided on the above-described array substrate 01 with the structures including the peripheral lead 10 formed thereon. That is, with respect to the base substrate 100, a position of the barrier wall structure 13 is higher than that of the peripheral lead 10, and thus, the conductive adhesive 02 subsequently formed can be blocked to diffuse to a direction of the peripheral lead 10.

Thirdly, the above-described conductive adhesive 02 can be, for example, a conductive adhesive material such as silver paste, which will not be limited by the embodiment of the present disclosure.

On this basis, by the above-described array substrate 01 provided by the embodiment of the present disclosure, since the barrier wall structure 13 is provided between the peripheral lead 10 and the ground signal terminal 12, if after the array substrate 01 and the color filter substrate are cell-assembled, breakage is generated at an edge of the color filter substrate due to cutting, the barrier wall structure 13 is also capable of blocking, when the conductive adhesive 02 is coated on the ground signal terminal 12 subsequently, the conductive adhesive 02 from penetrating in a direction from the cutting breakage to the peripheral lead 10 in the array substrate 01, which avoids signal crosstalk of the peripheral lead 10, and alleviates a problem of display defect of the display device generated due to inward penetration of the conductive adhesive.

On the above-described basis, the position and shape of the barrier wall structure 13 are as follows:

With reference to FIG. 1, the above-described array substrate 01 has an opposing region 01a opposite to the color filter substrate and a peripheral region 01b located outside the opposing region 01a. Here, in a direction perpendicular to the base substrate 100, an opposing region 01a of the base substrate 100 overlaps the color filter substrate, but the peripheral region 01b of the array substrate 01 does not overlap the color filter substrate. The barrier wall structure 13 is located at a corner of the opposing region 01a adjacent to the peripheral region 01b (as shown by the arrow in the figure), the ground signal terminal 12 is located at a position of the peripheral region 01b close to the corner; and the barrier wall structure 13 includes at least one barrier wall.

Figure 3A:
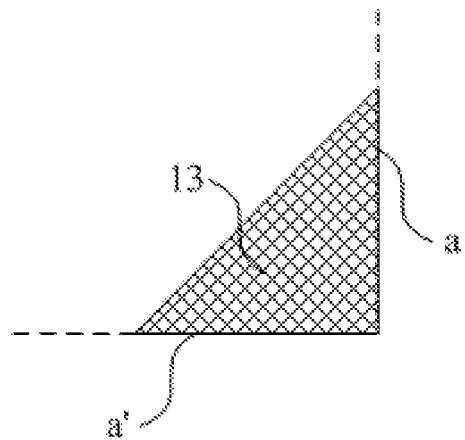
FIG. 3a is a top view structural schematic diagram I of a barrier wall structure in an array substrate provided by an embodiment of the present disclosure.

In one example, the barrier wall structure 13 is a first barrier wall. As shown in FIG. 3a, in a direction parallel to a plate surface of the array substrate 01, two intersecting sides of the cross section of the first barrier wall respectively overlap with two boundary lines (respectively marked as a and a' in the figure) forming the corner. That is, an orthogonal projection of the first barrier wall 13 on the base substrate 100 has a first straight edge a and a second straight edge a' connected with each other, the first straight edge a overlaps with an edge of the base substrate 100 (e.g., a lower edge), and the second straight edge a' overlaps with the interface between the opposing region and the peripheral region of the base substrate.

Figure 3B:
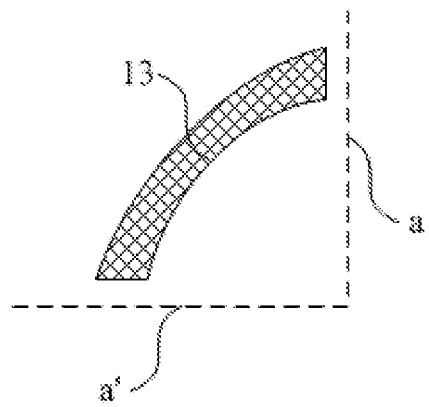
FIG. 3b is a top view structural schematic diagram II of a barrier wall structure in an array substrate provided by an embodiment of the present disclosure.

In another example, the barrier wall structure 13 is a second barrier wall. As shown in FIG. 3b, in the direction parallel to the plate surface of the array substrate 01; a cross section of the second barrier wall is an; two edges of the arc strip along a length direction is arc, and a circle center of the arc is located on a side of the arc close to the corner. That is, an orthogonal projection of the second barrier wall 13 on the base substrate 100 is also an arc strip, the arc strip has two arc edges, and a circle center of the two arc edges is located on a side of the arc toward the corner.

Figure 3C:
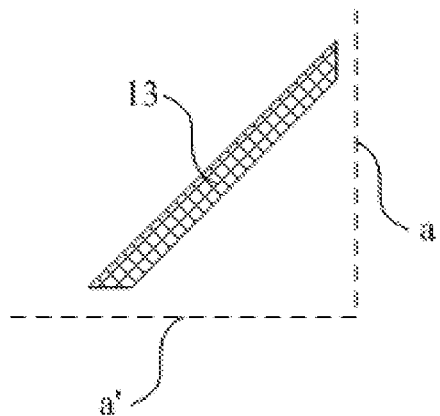
FIG. 3c is a top view structural schematic diagram III of a barrier wall structure in an array substrate provided by an embodiment of the present disclosure.

Alternatively, as shown in FIG. 3c, along a direction parallel to the plate surface of the array substrate 01, a cross section of the second barrier wall is a long strip; an acute included angle is provided between a length direction of the long strip and each of the two boundary lines a and a' forming the corner.

It should be noted that, since the array substrate 01 and the color filter substrate are cell-assembled to form the liquid crystal display panel, the opposing region 01a of the array substrate 01 is just the region opposite to the color filter substrate and covered by the color filter substrate, correspondingly, the peripheral region 01b of the array substrate 01 is just the region not covered by the color filter substrate.

In consideration that, in the peripheral region 01b, it is also necessary to retain a certain region for connecting and driving a circuit structure such as an integrated circuit (IC) and a Printed Circuit Board (PCB), with reference to FIG. 1, the ground signal terminal 12 is provided at the corner of the peripheral region 01b close to the edge of the color filter substrate, and the barrier wall structure 13 is correspondingly located at a corner of the opposing region 01a adjacent to the peripheral region 01b.

When the two intersecting sides in the cross section of the above-described barrier wall respectively overlap with the two boundary lines a and a' forming the corner, the cross section of the barrier wall has a right angle, equivalent to that a corner step, capable of blocking the conductive adhesive 02 from penetrating inwardly from a source; wherein, the two intersecting sides of the cross section of the barrier wall can be any two intersecting sides of the cross section thereof, its cross section is not limited to the right-angled triangle shown in FIG. 3, and its hypotenuse can be an arc or an irregular curve, which will not be limited here.

When the cross section of the above-described barrier wall is an arc strip or a long strip, such a setting that a circle center of the arc is located on a side of the arc close to the corner or that the length direction of the long strip and the two boundary lines a and a' forming the corner are provided as an acute included angle is intended to block the conductive adhesive 02 from penetrating toward the peripheral lead 10.

When the cross section of the second barrier wall 132 is a long strip, the cross section thereof may be a quadrangle shown with reference to FIG. 3c, and two sides of the quadrangle along the length direction of the long strip in the quadrangle are straight lines; or, two sides along the length direction of the long strip in its cross section may also be wavy lines or polygonal lines, which will not be specifically limited. In addition, a numerical value of the sharp included angle between the length direction and the two boundary lines a and a' forming the corner may be flexibly adjusted according to a total volume of the conductive adhesive.

When the cross section of the second barrier wall 132 is an arc strip, as compared with the second barrier wall 132 with a shape of a long strip, there is more buffer space between the second barrier wall 132 with a shape of a arc strip and the first barrier wall 131, which is capable of accommodating the conductive adhesive flowing over the first barrier wall 131, and making it confined within the region, and difficult to further penetrate inwardly.

Therefore, in the embodiment of the present disclosure, a shape of the second barrier wall 132 is, for example, the above-described arc strip, wherein a value range of a central angle of two arc-shaped edges of the arc strip along the length direction is not limited. In consideration that, if the value range of the center angle of the two arc-shaped edges of the arc strip along the length direction is too large, then the arc strip will take a larger area outside a pixel region A-A, the value range of the center angle is, for example, (45±5°).

Figure 4:
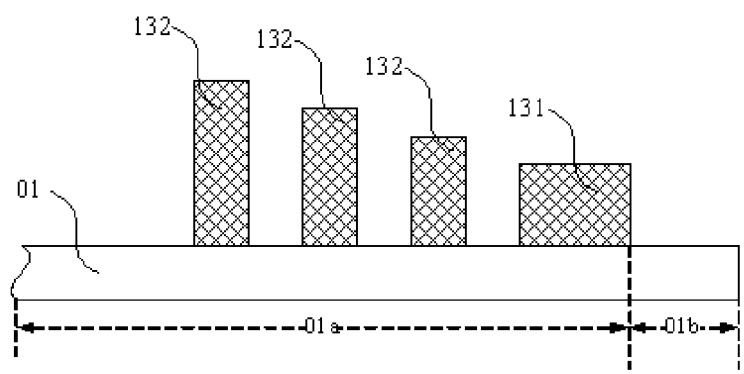
FIG. 4 is a cross-sectional view schematic diagram of a structure of a barrier wall structure in an array substrate provided by an embodiment of the present disclosure.
Figure 5A:
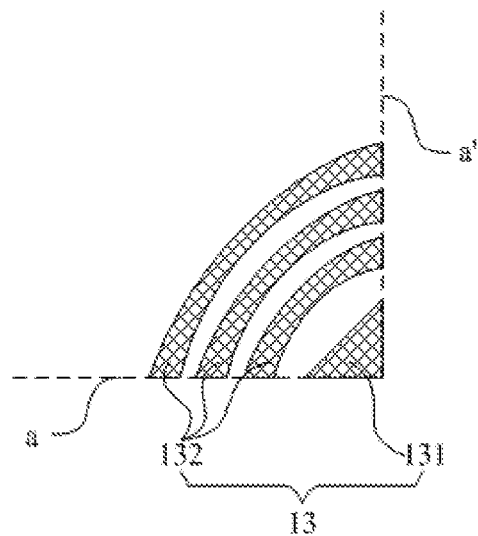
FIG. 5a is a top view structural schematic diagram IV of a barrier wall structure in an array substrate provided by an embodiment of the present disclosure.
Figure 5B:
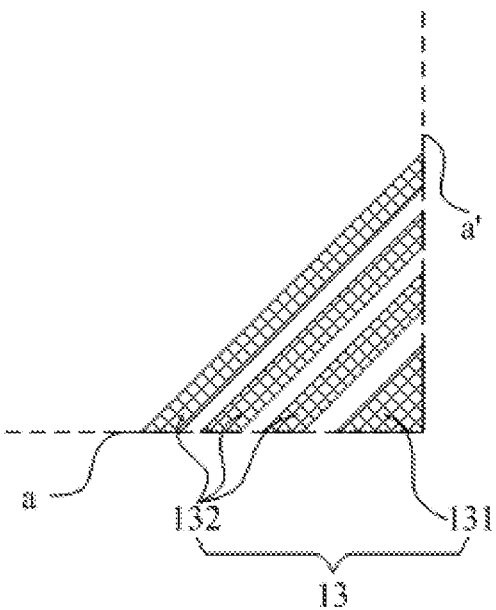
FIG. 5b is a top view structural schematic diagram V of a barrier wall structure in an array substrate provided by an embodiment of the present disclosure.

On the above basis, further, in order to improve efficiency of blocking the conductive adhesive 02, as shown in FIG. 4, the above-described barrier wall structure 13 includes at least two barrier walls; the at least two barrier walls are constituted by one first barrier wall 131 and at least one second barrier wall 132; the second barrier wall 132 is higher than the first barrier wall 131; in a direction parallel to the plate surface of the array substrate 01, the two intersecting sides in the cross section of the first barrier wall respectively overlap with the two boundary lines forming the corner; as shown in FIG. 5a or FIG. 5b, along the direction parallel to the plate surface of the array substrate, the cross section of the second barrier wall is an arc strip or a long strip.

Here, the first barrier wall 131 is equivalent to a corner step, and two right-angled sides of the cross section thereof respectively overlap the two boundary lines a and a' forming the corner, so that the first barrier wall 131 is as close as possible to the conductive adhesive 02 penetrating inwardly from the breakage of the color filter substrate, that is, the conductive adhesive 02 is blocked from penetrating inwardly from a source;

The cross section of the first barrier wall 131 may be, for example, an isosceles right-angled triangle or a non-isosceles right-angled triangle; in consideration that both sides of the isosceles right-angled triangle have a same length, which can uniformly block the conductive adhesive from penetrating inwardly from the two boundary lines forming the corner, the cross section of the first barrier wall 131 is, for example, an isosceles right-angled triangle.

In consideration that, when an area of coating the conductive adhesive 02 is relatively large, there may be more volume of the conductive adhesive 02 penetrating from the breakage of the color filter substrate of the liquid crystal display panel cell-assembled toward the peripheral lead 10 at the periphery of the array substrate 01, and the first barrier wall 131 provided with only one corner step may not be able to effectively block the conductive adhesive 02 from continuously penetrating inwardly, the present disclosure further provides at least one second barrier wall 132 away from the first barrier wall 131, and the second barrier wall 132 is higher than the first barrier wall 131, which can block the conductive adhesive 02 from continuously penetrating inwardly.

The number of the second barrier wall 132 is not limited, and when one second barrier wall 132 is provided, a region between the second barrier wall 132 and the first barrier wall 131 may be configured for buffering penetration of the conductive adhesive; and since the second barrier wall 132 is higher than the first barrier wall 131, it is also difficult for the penetrated conductive adhesive to flow over the second barrier wall 132 to continue to penetrate toward the direction of the peripheral lead 10; when a plurality of second barrier walls 132 are provided, a first second barrier wall 132 closest to the first barrier wall 131 plays a role in mitigating a trend of inward penetration of the conductive adhesive as described above, besides, a region between two adjacent second barrier walls 132 can further play a role in buffering and blocking inward penetration of the conductive adhesive.

Further, with reference to FIG. 5a or FIG. 5b, in consideration that the conductive adhesive is liable to flow during the coating process, if the second barrier wall 132 is too short, the conductive adhesive flowing over the first barrier wall 131 is liable to continue to penetrate along two ends of the second barrier wall 132 toward the direction of the peripheral lead 10; and thus, for example, the two ends of the second barrier wall 132 are respectively in contact with the two boundary lines a and a' at the corner.

In this way, when one second barrier wall 132 is provided, after the conductive adhesive flowing over the first barrier wall 131 is confined to the region between the first barrier wall 131 and the second barrier wall 132, it is difficult to continue to penetrate along the two ends of the second barrier wall 132 toward the direction of the peripheral lead 10; when a plurality of second barrier walls 132 are provided, since a shape at the corner is a right-angled triangle, if two ends of each second barrier wall 132 are made to be respectively in contact with the two boundary lines a and a' at the corner, then the length of each second barrier wall 132 will be sequentially increased in a direction away from the first barrier wall 131 and towards the second barrier wall 132, that is, it is difficult for the conductive adhesive confined to a region between any two adjacent second barrier walls 132 to continue to penetrate along the two ends of the second barrier wall 132 farther away from the conductive adhesive 02 toward the direction of the peripheral lead 10.

Further, in consideration that, if only one second barrier wall 132 is provided, then after the conductive adhesive flows over the second barrier wall 132, there is not any three-dimensional structure capable of blocking penetration of the conductive adhesive, a plurality of second barrier walls 132 should be appropriately provided; however, if the number of the second barrier wall 132 is too large, they will occupy a relatively large area outside the pixel region A-A, resulting in that a frame region of the liquid crystal display panel cell-assembled is too large, which is disadvantageous to a design requirement of a narrow-frame display device. Therefore, with reference to FIG. 5a or FIG. 5b, in the embodiment of the present disclosure, further, for example, the number of the second barrier wall 132 is 2 to 5; and in the direction away from the first barrier wall 131 and towards the second barrier wall 132, heights of respective second barrier walls 132 are sequentially increased.

Here, since the total volume of the conductive adhesive coated is limited after all, the volume of the conductive adhesive penetrating from the breakage of the color filter substrate of the liquid crystal display panel cell-assembled toward the inside of the array substrate 01 is also limited, the 2 to 5 spaced second barrier walls 132 whose heights are sequentially increased are just capable of effectively guiding the conductive adhesive penetrating inwardly and confining it between the first barrier wall 131 and the first second barrier wall 132, and/or the region between two adjacent second barrier walls 132, so as to effectively block the conductive adhesive from penetrating toward the peripheral lead 10.

Further, in consideration that in the prior art, a distance between the array substrate and the color filter substrate in the cell-assembled liquid crystal display panel is usually about 6000 Å, in order not to increase a box thickness of the liquid crystal display panel, the heights of the first barrier wall 131 and the second barrier walls 132 are all less that the distance between the array substrate and the color filter substrate.

Exemplarily, when a value range of a height of the first barrier wall 131 is 500 Å to 1500 Å, in the direction away from the first barrier wall and towards the second barrier wall, a value range of a height of the last second barrier wall 132 is 3500 Å to 4500 Å.

Here, a value range of a height difference between the second barrier wall 132 closest to the first barrier wall 131 and the first barrier wall 131 can be, for example, 200 Å to 1000 Å; a value range of a height difference between every two adjacent second barrier walls 132 may be, for example, 200 Å to 1000 Å.

Further, in consideration that, if a distance between the first barrier wall 131 and the second barrier wall 132, and a distance between the adjacent two second barrier walls 132 are too small, then an effect of leading out the permeated conductive adhesive is relatively weak, and the conductive adhesive unable to be led out may continue to penetrate toward the direction of the peripheral lead 10; for example, the second barrier wall 132 closest to the first barrier wall 131 has a side close to the first barrier wall 131, and a value range of a distance between a center of the side and the first barrier wall 131 is 8 μm to 15 μm; and/or, a value range of a distance between adjacent two second barrier walls 132 is 8 μm to 15 μm.

Further, in consideration that the volume of the conductive adhesive penetrating inside is limited, and after the conductive adhesive flowing over the first barrier wall 131 is confined to the region between the first barrier wall 131 and the first second barrier wall 132, a portion in the conductive adhesive capable of flowing over the first second barrier wall 132 is less; Therefore, for example, the distance between the center of the side, close to the first barrier wall 131, of the second barrier wall 132 closest to the first barrier wall 131 and the first barrier wall 131 is greater than the distance between the adjacent two second barrier walls 132, and in the direction away from the first barrier wall 131 and towards the second barrier wall 132, distances between adjacent two second barrier walls 132 are sequentially reduced.

Here, when the second barrier wall 132 is, for example, an arc strip, the distance between the center of the side, close to the first barrier wall 131, of the second barrier wall 132 closest to the first barrier wall 131 and the first barrier wall 131 is a straight line distance from a center of one arc edge, close to the first barrier wall 131, of the cross section of the arc strip to the first barrier wall 131.

When the second barrier wall 132 is, for example, a long strip, the distance between the center of the side, close to the first barrier wall 131, of the second barrier wall 132 closest to the first barrier wall 131 and the first barrier wall 131 is a straight line distance from a center of one straight edge, close to the first barrier wall 131, of the cross section of the long strip to the first barrier wall 131.

Further, when the cross-sectional pattern of the first barrier wall 131 is an isosceles right-angled triangle, and a side length of the isosceles right-angled triangle is in a value rang of 80 μm to 120 μm, since the first barrier wall 131 used as a corner step is capable of blocking the conductive adhesive from penetrating inwardly from a source, a cross-sectional width of the second barrier wall 132 (i.e., a strip width of the arc strip or the long strip) does not need to be set to relatively large, as long as its value range is 8 μm to 12 μm.

On the above basis, an embodiment of the present disclosure further provides a fabrication method of the above-described array substrate 01. The fabrication method includes:

Forming a film layer on a base substrate 100;

Performing a patterning process on the film layer, to form a barrier wall structure 13 configured for blocking a conductive adhesive from penetrating toward a direction of a peripheral lead 10; wherein, the barrier wall structure 13 is located between the peripheral lead 10 and a ground signal terminal 12; and the ground signal terminal 12 is configured for connecting with a transparent conductive layer on a color filter substrate through the conductive adhesive.

It should be noted that, firstly, the above-described film layer can be made of an insulating material or a conductive material; in consideration that the barrier wall structure 13 has a certain height, if the film layer is made of a conductive material (e.g., a metal or an alloy), an etching process has a higher degree of complexity. Thus, the film layer can be selected to be made of an insulating material, for example, a material the same as that of a passivation layer (abbreviated as PVX) in the array substrate 01 can be used, to simplify complexity of the process.

According to the pattern of the barrier wall structure 13, that is, when the barrier wall structure 13 includes one first barrier wall 131 and a plurality of second barrier walls 132 whose heights are sequentially increased, the barrier wall structure 13 constituted by a variety of patterns can be formed by integrated successive etching process.

Secondly, the patterning process refers to a process of processing the film layer, to obtain a corresponding pattern. For example, it may include processes of exposing, developing and etching (including etching for many times) the photoresist, and removing the photoresist by applying one mask.

On the above basis, with reference to FIG. 4, the above-described barrier wall structure 13, for example, includes: one first barrier wall 131 and at least two second barrier walls 132 away from the first barrier wall 131; wherein, a height of the first barrier wall 131 is less than heights of the second barrier walls 132; and in a direction away from the first barrier wall 131 and towards the second barrier wall 132, heights of the respective second barrier walls 132 are sequentially increased.

Here, the steps of performing a patterning process on the above-described film layer, and forming one first barrier wall 131 and at least two second barrier walls 132 away from the first barrier wall 131, for blocking the conductive adhesive from diffusing toward the peripheral lead, for example, include:

Forming a photoresist layer on the film layer;

Exposing and developing the substrate with the photoresist layer formed thereon by a half-tone or a gray-tone mask, to form a photoresist completely-reserved portion, photoresist half-reserved portions whose heights are sequentially reduced, and a photoresist completely-removed portion; wherein, the photoresist completely-reserved portion corresponds to the highest second barrier wall 132 to be formed, and the photoresist half-reserved portions whose heights are sequentially reduced sequentially correspond to the remaining second barrier walls 132 to be formed whose heights are sequentially reduced and the first barrier wall 131, and the photoresist completely-removed portion corresponds to a region where the barrier wall structure is not formed;

Removing the film layer in the region where the barrier wall structure is not formed, by an etching process;

Forming the first barrier wall 131 and the at least two second barrier walls 132 away from the first barrier wall 131, by an ashing and etching process.

Figure 6:
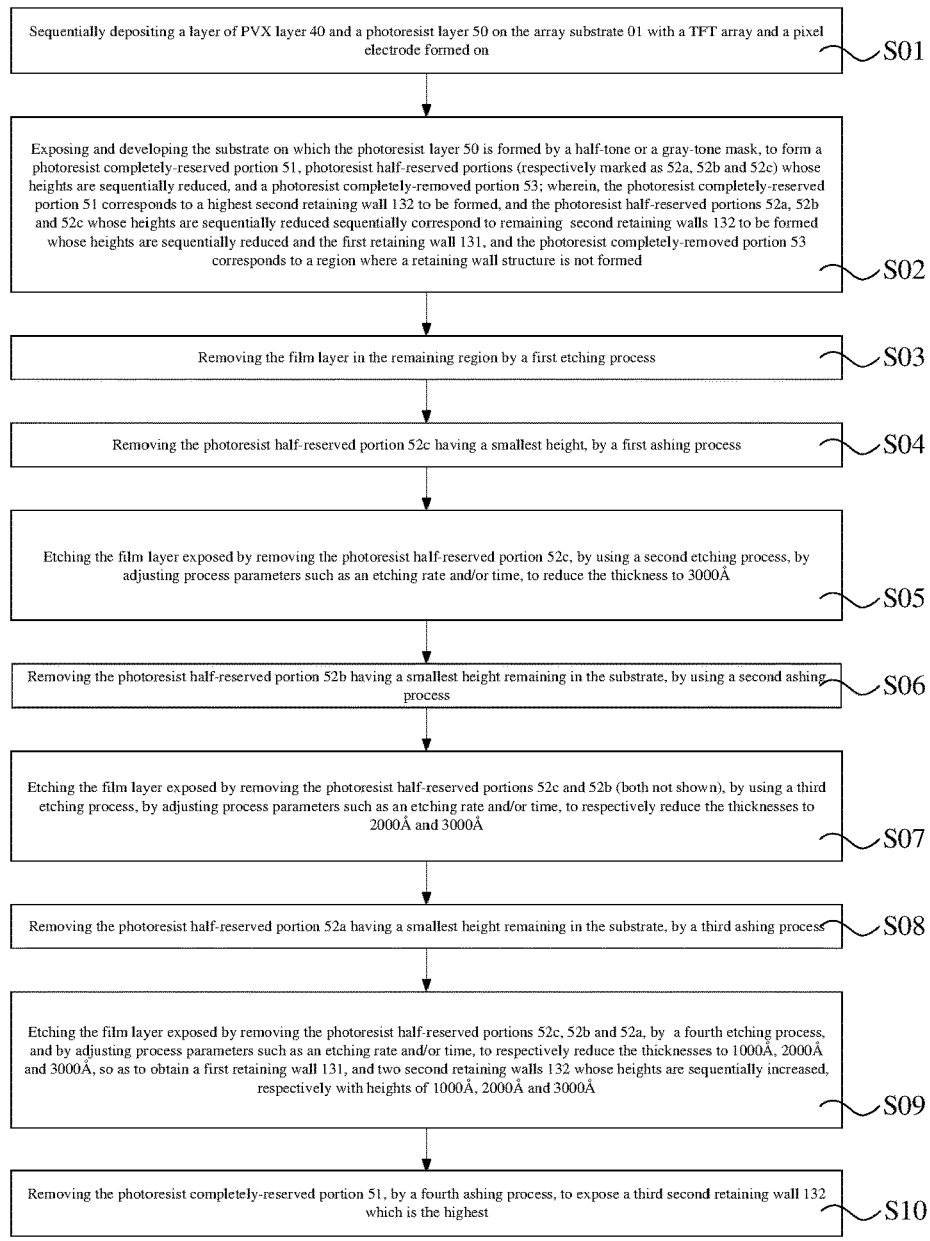
FIG. 6 is a flow chart of fabricating a barrier wall structure in an array substrate provided by a specific embodiment of the present disclosure.
Figure 7:
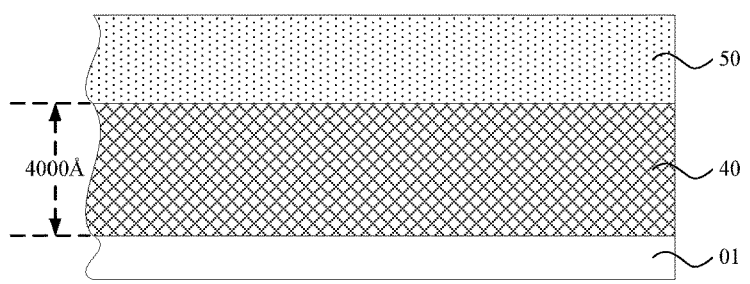
FIGS. 7 to 16 are cross-sectional views schematic diagrams of structures of the array substrate in the respective steps in FIG. 6.

Here, the barrier wall structure 13, for example, includes, the first barrier wall 131 and 3 second barrier walls 132 whose heights are sequentially increased, wherein, the height of the first barrier wall 131 is 1000 Å, and the heights of the 3 second barrier walls 132 are respectively 2000 Å, 3000 Å and 4000 Å. As described in FIG. 6, a fabrication method of the above-described array substrate 01 is provided below:

S01: sequentially depositing a layer of PVX layer 40 and a photoresist layer 50 on the array substrate 01 with a TFT array and a pixel electrode (a common electrode can also be included) formed thereon, as shown in FIG. 7.

Here, a thickness of the PVX layer 40 is 4000 Å, which is the height of the highest second barrier wall 132.

Figure 8:
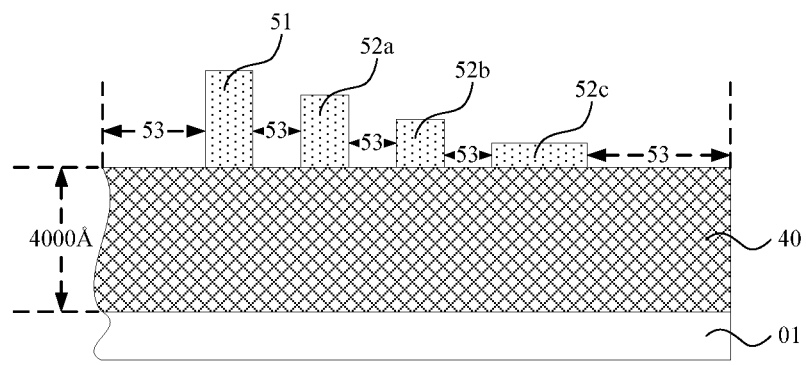

S02: exposing and developing the substrate with the photoresist layer 50 formed thereon by a half-tone or a gray-tone mask, to form a photoresist completely-reserved portion 51, photoresist half-reserved portions (respectively marked as 52a, 52b and 52c) whose heights are sequentially reduced, and a photoresist completely-removed portion 53; wherein, the photoresist completely-reserved portion 51 corresponds to the highest second barrier wall 132 to be formed, and the photoresist half-reserved portions 52a, 52b and 52c whose heights are sequentially reduced sequentially correspond to the remaining second barrier walls 132 to be formed whose heights are sequentially reduced and the first barrier wall 131, and the photoresist completely-removed portion 53 corresponds to a region where the barrier wall structure is not formed, as shown in FIG. 8;

Here, for an exposure principle of the half-tone or the gray-tone mask, a related art can be referred to, which will not be repeated by the embodiment of the present disclosure.

It should be noted that, in order to obtain the photoresist half-reserved portions 52a, 52b and 52c whose heights are sequentially reduced, when the photoresist layer is made of a positive photoresist material, transmittance at an half exposed position is inversely proportional to a step height of the photoresist half-reserved portion; and when the photoresist layer is made of a negative photoresist material, the transmittance at the half expose position is proportional to the step height of the photoresist half-reserved portion.

Therein, the positive photoresist refers to a type of photoresist which is insoluble in a developer before exposure, but after exposed to ultraviolet light, becomes soluble in the developer; and the negative photoresist refers to a type of photoresist which is soluble in a developer before exposure, but after exposure to ultraviolet light, becomes insoluble in the developer.

Figure 9:
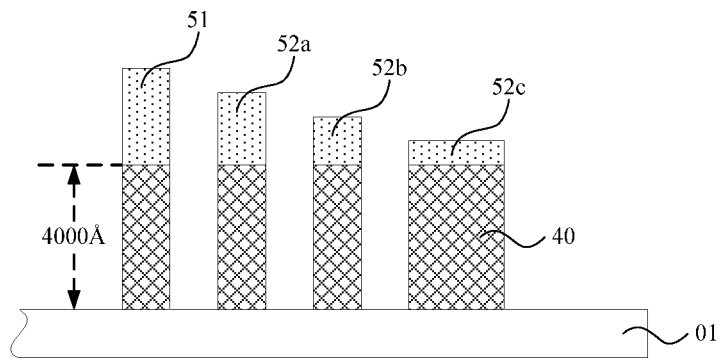

S03: removing the film layer in the remaining region by a first etching process, as shown in FIG. 9.

Figure 10:
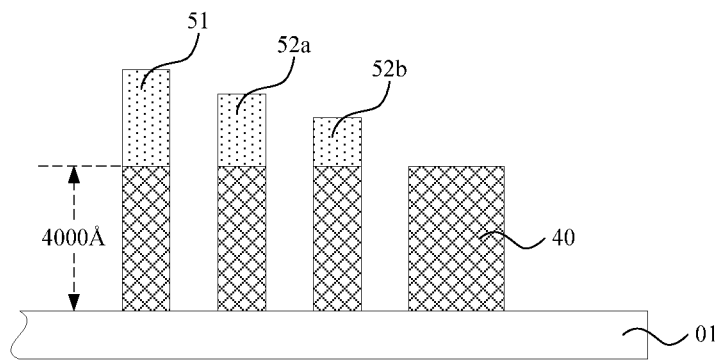

S04: removing the photoresist half-reserved portion 52c with the smallest height, by a first ashing process, as shown in FIG. 10.

Figure 11:
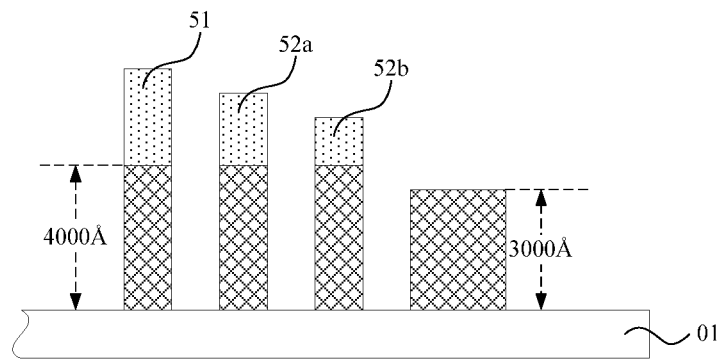

S05: etching the film layer exposed by removing the photoresist half-reserved portion 52c (not shown), by a second etching process, and by adjusting process parameters such as an etching rate and/or time, to reduce the thickness to 3000 Å, as shown in FIG. 11.

Figure 12:
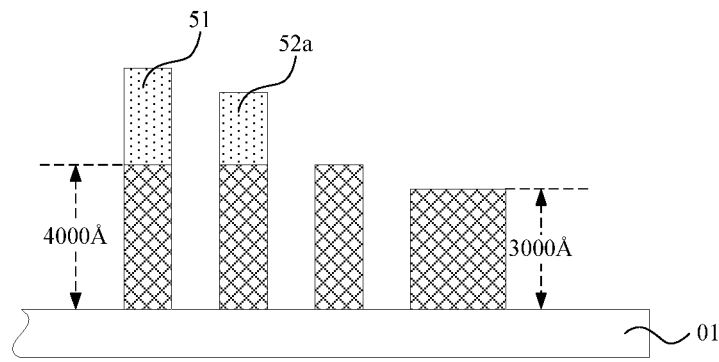

S06: removing the photoresist half-reserved portion 52b having the smallest height remaining in the substrate, by a second ashing process, as shown in FIG. 12.

Figure 13:
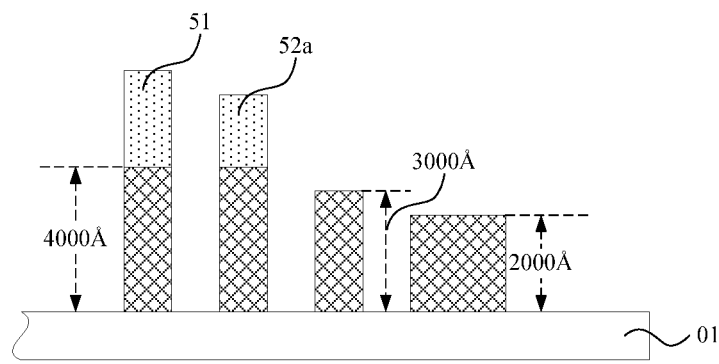

S07: etching the film layer exposed by removing the photoresist half-reserved portions 52c and 52b (both not shown), by a third etching process, and by adjusting process parameters such as an etching rate and/or time, to respectively reduce the thicknesses to 2000 Å and 3000 Å, as shown in FIG. 13.

Figure 14:
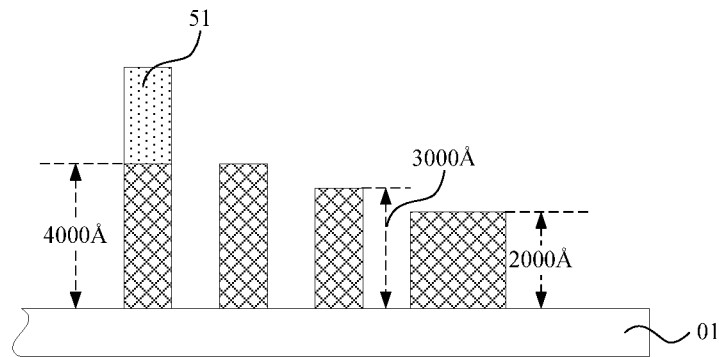

S08: removing the photoresist half-reserved portion 52a having the smallest height remaining in the substrate, by a third ashing process, as shown in FIG. 14.

Figure 15:
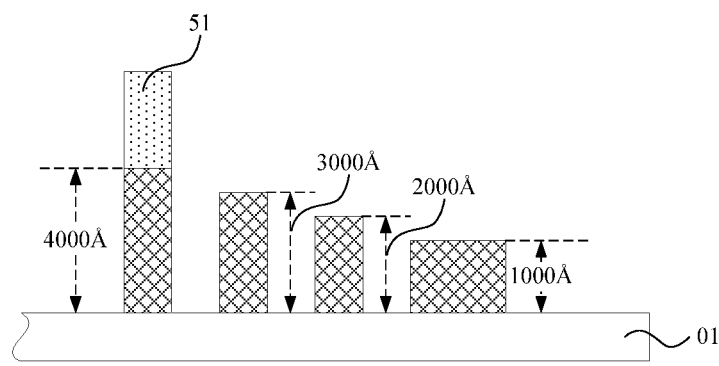

S09: etching the film layer exposed by removing the photoresist half-reserved portions 52c, 52b and 52a (all of 52c to 52a not shown), by a fourth etching process, and by adjusting process parameters such as an etching rate and/or time, to respectively reduce the thicknesses to 1000 Å, 2000 Å and 3000 Å, so as to obtain a first barrier wall 131, and two second barrier walls 132 whose heights are sequentially increased, respectively with heights of 1000 Å, 2000 Å and 3000 Å, as shown in FIG. 15.

Figure 16:
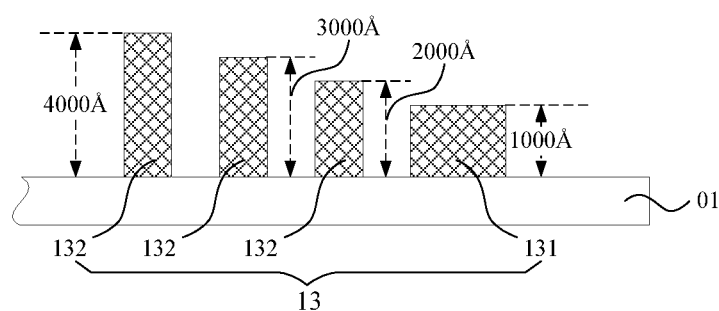

S10: removing the photoresist completely-reserved portion 51, by a fourth ashing process, to expose a third second barrier wall 132 which is the highest, as shown in FIG. 16.

In this way, by the above-described integrated etching process of successive ashing processes and successive etching processes, that is, forming the above-described barrier wall structure 13 on the array substrate 01 on which structures such as the TFT array and the pixel electrode which are necessary to constitute the array substrate 01 have already been formed, penetration of the conductive adhesive is effectively blocked, and after the conductive adhesive flows over the closest first barrier wall 131, it is possible to lead out the penetrated conductive adhesive by a plurality of second barrier walls 132 whose heights are sequentially increased, to block it from continuing to diffuse toward the peripheral lead.

On the above-described basis, an embodiment of the present disclosure further provides a display device, including: a color filter substrate, the color filter substrate with a transparent conductive layer 30 provided therein; and the display device further includes: the above-described array substrate 01 which is opposite to the color filter substrate; and the transparent conductive layer 30 being connected with a ground signal terminal 12 on the array substrate 01 through a conductive adhesive 02.

The above-described display device can be, for example, a liquid crystal display, a liquid crystal television, a digital photo frame, a mobile phone, a tablet personal computer, or any other product or component having a display function.

What needs to be explained is that, all the drawings of the present disclosure are abbreviated schematic diagrams of the above-described array substrate, structures relevant to the present disclosure are embodied to clearly describe the scheme, and other structure irrelevant to the present disclosure are existing structures and are not embodied in the drawings or are partially embodied.

The foregoing embodiments merely are exemplary embodiments of the present disclosure, and not intended to define the scope of the present disclosure, and the scope of the present disclosure is determined by the appended claims.

The present application claims priority of Chinese Patent Application No. 201510719693.4 filed on Oct. 29, 2015, the present disclosure of which is incorporated herein by reference in its entirety as part of the present application.

The invention claimed is:

1. An array substrate, comprising a base substrate, and a peripheral lead, a ground signal terminal, a conductive adhesive, and a barrier wall structure located on the base substrate,
   wherein, the conductive adhesive is connected with the ground signal terminal, and the barrier wall structure is located between the peripheral lead and the ground signal terminal and configured for blocking the conductive adhesive from diffusing toward the peripheral lead;
   the base substrate has an opposing region opposite to a counter substrate and a peripheral region located outside the opposing region; and
   the barrier wall structure is located at a corner of the opposing region adjacent to the peripheral region, and the ground signal terminal is located in the peripheral region.

2. The array substrate according to claim 1, wherein, the conductive adhesive is connected with the barrier wall structure.

3. The array substrate according to claim 1, wherein, the barrier wall structure includes at least one of a first barrier wall and a second barrier wall,
   the corner of the opposing region of the base substrate is formed at an intersection of a boundary between the opposing region and the peripheral region of the base substrate and an edge of the base substrate,
   an orthogonal projection of the first barrier wall on the base substrate has a first straight edge and a second straight edge connected with each other, the first straight edge overlaps an edge of the base substrate, and the second straight edge overlaps the boundary between the opposing region and the peripheral region of the base substrate;
   an orthogonal projection of the second barrier wall on the base substrate is an arc strip, the arc strip has two arc edges, and circle centers of the two arc edges are located on a side of the arc strip toward the corner; or, the orthogonal projection of the second barrier wall on the base substrate is a strip, and an acute included angle is formed between a length direction of the strip and each of two boundary lines forming the corner.

4. The array substrate according to claim 3, wherein, the barrier wall structure includes the first barrier wall and the second barrier wall, and in a direction perpendicular to the base substrate, a height of the first barrier wall is less than that of the second barrier wall.

5. The array substrate according to claim 3, wherein, the barrier wall structure includes the second barrier wall, the orthogonal projection of the second barrier wall on the base substrate has a third straight edge and a fourth straight edge opposite to each other, the third straight edge overlaps the edge of the base substrate, and the fourth straight edge overlaps the boundary between the opposing region and the peripheral region of the base substrate.

6. The array substrate according to claim 3, wherein, the barrier wall structure includes one first barrier wall and a plurality of the second barrier walls, a number of the second barrier walls is 2 to 5, the first barrier wall and the plurality of second barrier walls are spaced apart from each other, and in a direction away from the first barrier wall and towards the second barrier walls, heights of the respective second barrier walls are sequentially increased.

7. The array substrate according to claim 6, wherein, a value range of a height of the first barrier wall is 500 Å to 1500 Å, and in the direction away from the first barrier wall, a value range of a height of a last second barrier wall is 3500 Å to 4500 Å.

8. The array substrate according to claim 6, wherein, a value range of a height difference between the second barrier wall closest to the first barrier wall and the first barrier wall is 200 Å to 1000 Å; and a value range of a height difference between any two adjacent ones of second barrier walls is 200 Å to 1000 Å.

9. The array substrate according to claim 6, wherein, a value range of a distance between a center of a side, close to the first barrier wall, of the second barrier wall closest to the first barrier wall and the first barrier wall is 8 μm to 15 μm;
and/or, a value range of a distance between adjacent ones of the second barrier walls is 8 μm to 15 μm.

10. The array substrate according to claim 6, wherein, the distance between the center of the side, close to the first barrier wall, of the second barrier wall closest to the first barrier wall and the first barrier wall is greater than the distance between any two adjacent ones of second barrier walls, and in the direction away from the first barrier wall and towards the second barrier walls, distances between adjacent ones of the second barrier walls are sequentially reduced.

11. The array substrate according to claim 6, wherein, the orthogonal projection of the first barrier wall on the base substrate is an isosceles right-angled triangle, a side length of the isosceles right-angled triangle is in a value range of 80 μm to 120 μm, and a value range of a width of the orthogonal projection of the second barrier wall on the base substrate is 8 μm to 12 μm.

12. A fabrication method of an array substrate, the fabrication method comprising:
forming a film layer on a base substrate; and
performing a patterning process on the film layer to form a barrier wall structure,
wherein, the barrier wall structure is configured for blocking a conductive adhesive from diffusing toward a peripheral lead, the barrier wall structure is located between the peripheral lead and a ground signal terminal, and the ground signal terminal is connected with the conductive adhesive,
the base substrate has an opposing region opposite to a counter substrate and a peripheral region located outside the opposing region,
the barrier wall structure is located at a corner of the opposing region adjacent to the peripheral region, and the ground signal terminal is located in the peripheral region.

13. The fabrication method according to claim 12, wherein, the barrier wall structure includes: a first barrier wall and at least two second barrier walls, the first barrier wall and the at least two second barrier walls are spaced apart from each other, and in a direction perpendicular to the base substrate, a height of the first barrier wall is less than that of the at least two second barrier walls; and in a direction away from the first barrier wall and towards the second barrier wall, heights of the at least two second barrier walls are sequentially increased;
the performing a patterning process on the film layer to form a barrier wall structure includes:
forming a photoresist layer on the film layer;
exposing and developing the base substrate with the photoresist layer formed thereon by a half-tone or a gray-tone mask, to form a photoresist completely-reserved portion, photoresist half-reserved portions whose heights are sequentially reduced, and a photoresist completely-removed portion; wherein, the photoresist completely-reserved portion corresponds to a highest second barrier wall to be formed, and the photoresist half-reserved portions whose heights are sequentially reduced respectively correspond to remaining second barrier wall(s) to be formed whose height(s) are sequentially reduced and the first barrier wall, and the photoresist completely-removed portion corresponds to a region where the barrier wall structure is not located;
removing the film layer in the region where the barrier wall structure is not located by an etching process; and
forming one first barrier wall and at least two second barrier walls away from the first barrier wall by an ashing and etching process.

14. A display device, comprising: a counter substrate and a transparent conductive layer formed therein; wherein, the display device further comprises: the array substrate according to claim 1 which is opposite to the counter substrate; and the transparent conductive layer being connected with the ground signal terminal on the array substrate through the conductive adhesive.

15. The array substrate according to claim 2, wherein, the barrier wall structure includes at least one of a first barrier wall and a second barrier wall,
the corner of the opposing region of the base substrate is formed at an intersection of a boundary between the opposing region and the peripheral region of the base substrate and an edge of the base substrate,
an orthogonal projection of the first barrier wall on the base substrate has a first straight edge and a second straight edge connected with each other, the first straight edge overlaps an edge of the base substrate, and the second straight edge overlaps the boundary between the opposing region and the peripheral region of the base substrate;
an orthogonal projection of the second barrier wall on the base substrate is an arc strip, the arc strip has two arc edges, and circle centers of the two arc edges are located on a side of the arc strip toward the corner; or, the orthogonal projection of the second barrier wall on the base substrate is a strip, and an acute included angle is formed between a length direction of the strip and each of two boundary lines forming the corner.

16. The array substrate according to claim 4, wherein, the barrier wall structure includes the second barrier wall, the orthogonal projection of the second barrier wall on the base substrate has a third straight edge and a fourth straight edge opposite to each other, the third straight edge overlaps the edge of the base substrate, and the fourth straight edge overlaps the boundary between the opposing region and the peripheral region of the base substrate.

17. The array substrate according to claim 4, wherein, the barrier wall structure includes one first barrier wall and a plurality of the second barrier walls, a number of the second barrier walls is 2 to 5, the first barrier wall and the plurality of second barrier walls are spaced apart from each other, and in a direction away from the first barrier wall and towards the second barrier walls, heights of the respective second barrier walls are sequentially increased.

\* \* \* \* \*